(12) United States Patent
Sanchez

(10) Patent No.: US 11,063,590 B1
(45) Date of Patent: Jul. 13, 2021

(54) HIGH VOLTAGE INTEGRATED CIRCUIT DEVICES WITH HOT CARRIER INJECTION DAMAGE PROTECTION

(71) Applicant: NXP USA, Inc., Austin, TX (US)

(72) Inventor: Hector Sanchez, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/097,050

(22) Filed: Nov. 13, 2020

(51) Int. Cl.
| | | |
|---|---|---|
| *H03L 5/00* | (2006.01) |
| *H03K 17/693* | (2006.01) |
| *H03K 19/0185* | (2006.01) |
| *H03K 19/003* | (2006.01) |
| *H03K 3/356* | (2006.01) |

(52) U.S. Cl.
CPC ..... *H03K 17/693* (2013.01); *H03K 3/356113* (2013.01); *H03K 3/356182* (2013.01); *H03K 19/00315* (2013.01); *H03K 19/018521* (2013.01)

(58) Field of Classification Search
CPC ..... H03K 19/018521; H03K 3/356113; H03K 19/00315; H03K 17/102; H03K 3/012
USPC .......................... 327/333; 326/63, 68, 80, 81
See application file for complete search history.

(56) References Cited

U.S. PATENT DOCUMENTS 9,191,006 B1 * 11/2015 Lin .................. H03K 3/356165
10,128,835 B2 11/2018 Singh 2007/0001716 A1 * 1/2007 Sanchez ......... H03K 19/018585
327/112
2007/0007996 A1 * 1/2007 Ranganathan ..... H03K 19/0013
326/34
2019/0081656 A1 * 3/2019 Ekambaram ............. H04B 1/44

FOREIGN PATENT DOCUMENTS

WO WO-2019024803 A1 * 2/2019 ......... H03K 19/0185

OTHER PUBLICATIONS

Sanchez et al., "A Versatile 3.3/2.5/1.8-V CMOS I/O Driver Built in a 0.2-m, 3.5-nm Tox, 1.8-V CMOS Technology," IEEE Journal of Solid-State Circuits, vol. 34, No. 11, Nov. 1999, 11 pages.

* cited by examiner

*Primary Examiner* — Quan Tra
(74) *Attorney, Agent, or Firm* — Mary Jo Bertani

(57) ABSTRACT

A circuit with a first transistor includes a first current electrode coupled to a first voltage supply, a second current electrode coupled to a first circuit node, and a gate electrode coupled to receive a first input signal. A second transistor includes a first current electrode coupled to the second current electrode of the first transistor, a second current electrode, and a gate electrode coupled to receive a first bias voltage. A third transistor includes a first current electrode coupled to the second current electrode of the second transistor, a second current electrode coupled to a second circuit node, and a gate electrode. A fourth transistor includes a first current electrode coupled to the second circuit node, a second current electrode coupled to a third circuit node, and a gate electrode coupled to receive a second bias voltage. The gate electrode of the third transistor is coupled to the third circuit node. A fifth transistor includes a first current electrode coupled to the third circuit node, a second current electrode coupled to a second voltage supply terminal, and a gate electrode coupled to receive a second input signal.

20 Claims, 5 Drawing Sheets

HIGH VOLTAGE INTEGRATED CIRCUIT DEVICES WITH HOT CARRIER INJECTION DAMAGE PROTECTION

BACKGROUND

Field

This disclosure relates generally to integrated circuit devices, and more specifically, to high voltage integrated circuit devices with hot carrier injection damage protection.

Related Art

Hot carrier injection (HCI) occurs in metal oxide semiconductor field effect transistor (MOSFET) devices when an electron gains sufficient energy to jump from the conducting channel or doped electrode regions in the silicon substrate to the gate dielectric. Hot electrons can be created when a channel is conductive and some electrons tunnel out of the silicon substrate and into surrounding materials forming an electron-hole pair, instead of recombining with a hole or being conducted through the substrate to a collector. Effects of hot carrier injection include increased leakage current and possible damage to the dielectric material if the hot electron causes breakdown of the dielectric structure.

In previously known circuits, protection schemes with stacked MOSFET devices are exposed to sensitivities in timing and contention during level shifting that can lead to momentary increases in drain-source voltage across the stacked MOSFET devices. The momentary increases can be particularly dangerous when operated at higher voltages than the maximum rating of the devices. Further complicating the problem, as the devices are damaged, there is increased contention between the high and low levels during switching, causing longer switching times and even more damage due to the increased length of time the devices are at voltage levels higher than their rating.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of integrated circuits disclosed herein provide robust protection from hot carrier injection (HCI) effects in cross-coupled level shifters, input/output circuit output stages, and digital logic blocks where a tri-state gate can have independent P versus N field effect transistor (FET) gate timing control. Embodiments of the present invention take advantage of fast capacitive coupling local to stacked FETs to ensure that the dynamic behavior of the transistor terminals does not exceed maximum drain-source voltage, thereby preventing hot carrier injection that could cause potential damage over the lifetime of the devices.

Figure 1:
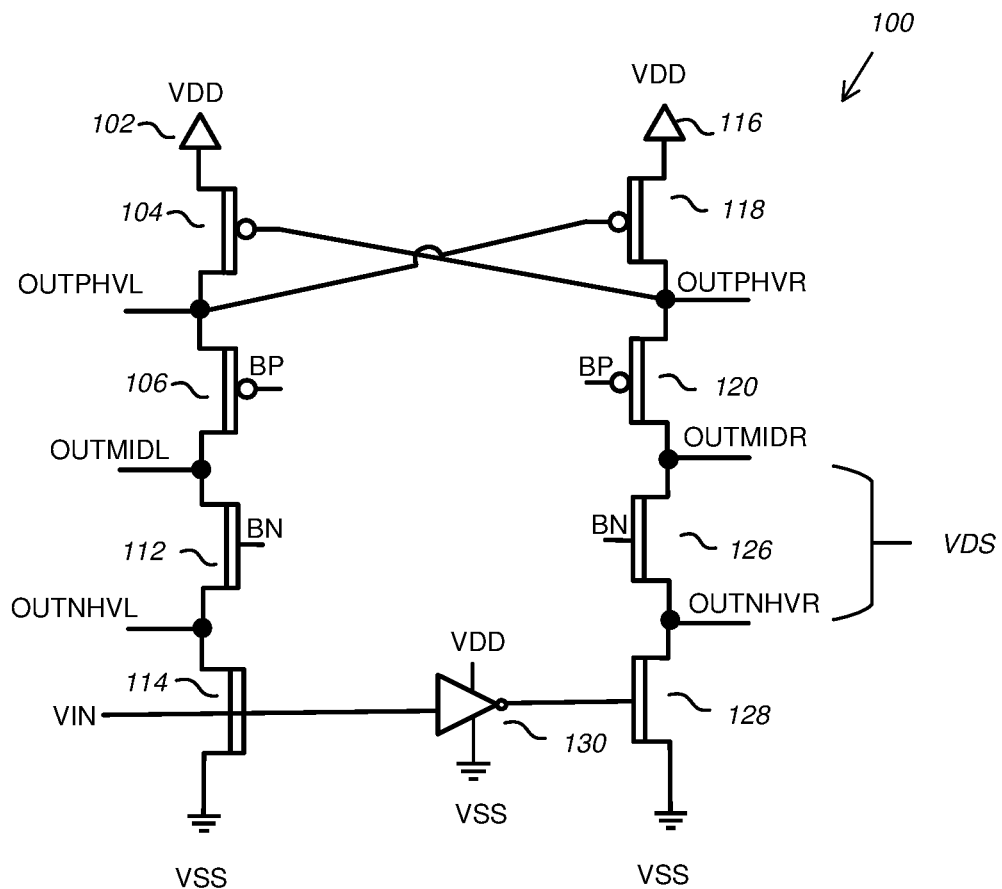
FIG. 1 illustrates a schematic diagram of an integrated circuit for a level shifter without HCI protection.

FIG. 1 illustrates a schematic diagram of an integrated circuit for level shifter 100 without HCI protection that includes an input stage with P-channel transistors 104, 106 stacked in series with N-channel transistors 112, 114. An output stage of level shifter 100 includes P-channel transistors 118, 120 stacked in series with N-channel transistors 126, 128. Inverter 130 has an input terminal coupled to an input voltage (VIN) and to a control gate of N-channel transistor 114. An output of inverter 130 is coupled to a control gate of N-channel transistor 128. Inverter 130 is further coupled between core supply voltage (VDD) and ground (VSS).

An input side of level shifter 100 includes P-channel transistor 104 with a first current electrode coupled to voltage supply (VDD) 102, a second current electrode coupled to a first current electrode of P-channel transistor 106, and a control gate coupled to a control gate of N-channel transistor 124 and between a second (drain) electrode of P-channel transistor 118 and a first (source) current electrode of P-channel transistor 120. P-channel transistor 106 includes a control gate coupled to P bias voltage (BP) and a second current electrode coupled to a first current electrode of N-channel transistor 112. N-channel transistor 112 includes a second current electrode coupled to a first current electrode of N-channel transistor 114 and a control gate coupled to an N bias voltage (BN). N-channel transistor 114 further includes a second current electrode 114 coupled to supply voltage (VSS) and a control gate coupled to the input voltage (VIN) and the input of inverter 130.

The output of level shifter 100 can be either or both of OUTPHVL and OUTPHVR, or either or both of OUTNHVL and OUTNHVR. As an example, consider an output side of level shifter 100 includes P-channel transistor 118 with a first current electrode coupled to voltage supply (VDD) 116, a second current electrode coupled to a first current electrode of P-channel transistor 120, and a control gate coupled to a control gate of N-channel transistor 124 and between a second (drain) electrode of P-channel transistor 118 and a first (source) current electrode of P-channel transistor 120. P-channel transistor 120 includes a control gate coupled to P bias voltage (BP) and a second current electrode coupled to a first current electrode of N-channel transistor 126. N-channel transistor 126 includes a second current electrode coupled to a first current electrode of N-channel transistor 128 and a control gate coupled to an N bias voltage (BN). N-channel transistor 128 further includes a second current electrode 128 coupled to supply voltage (VSS) and a control gate coupled to the output of inverter 130.

Level shifter 100 translates signals from one power domain to another and can be used to enable circuits that generate signals at different voltage levels to communicate with each other. For example, one circuit or device may operate at 1.8 Volts and is coupled to communicate with another circuit or device that operates at 3.3 Volts. Level shifter 100 translates signals from the lower voltage to the higher voltage, and vice versa. When input signal VIN is in a low level (VSS), N-channel transistor 114 is turned off. At the same time, a signal at the level of supply voltage VDD is applied via inverter circuit 130 to the gate of N-channel transistor 128, turning transistor 128 on so that node OUTPHVR switches to a voltage level of approximately BP plus the threshold voltage of P-channel transistor 118, and output node OUTMIDR switches to VSS. Due to the cross-coupling from node OUTPHVR to the gate of P-channel transistor 104, P-channel transistor 104 is turned on so that node OUTPHVL has a voltage level of VDD. Thus, when the input signal VIN is at a low level, output node OUTMIDR is at a voltage level of VSS and node OUTPHVR is at a voltage level of approximately BP plus the threshold voltage of P-channel transistor 104.

When the input signal VIN is in a high level (VDD), N-channel transistor 114 is turned on. As a result, node OUTPHVL has a voltage level of approximately BP plus the threshold voltage of N-channel transistor 128. At the same time, a low input signal is applied via inverter circuit 130 to the gate of the N-channel transistor 128, turning transistor 128 off. Due to the cross coupling from node OUTPHVL to the gate of P-channel transistor 118, transistor 118 is turned on, and output node OUTMIDR is at the voltage level of VDD. Consequently, when the input signal VIN is at a high level, output node OUTPHVR is at voltage level of VDD, and node OUTPHVL is at a voltage level of approximately BP plus the threshold voltage of N-channel transistor 114.

N bias voltage and P bias voltage are coupled to the control gates of respective N-channel transistors 112, 126 and P-channel transistors 106, 120. N bias voltage controls how high the signal to N-channel transistors 114, 128 goes and is set to VDD/2. P bias voltage controls how low the signal to P-channel transistors 104, 118 goes and is also set to VDD/2. Accordingly, N-channel transistors 112, 126 and P-channel transistors 106, 120 form a protection circuit that limits voltage on transistors 104, 118, 114, 128.

During switching, when input signal VIN changes from low to high, N-channel transistor 114 turns on and attempts to pull the node OUTPHVR from the voltage level VDD to P bias voltage level (VDD/2). However, P-channel transistor 104 is still on and resists (or "contends with") the drop in voltage at node OUTPHVL. The contention causes the voltage across the drain and source of transistor 112 to spike during transitions from low to high input voltage because the source of transistor 112 is at N bias voltage level (VDD/2) and the drain is at VSS.

A similar conflict between the P-channel and N-channel transistors 118, 128 occurs when the input signal VIN changes from high to low. N-channel transistor 128 turns on and attempts to pull the output node OUTPHVL from the high voltage level of VDD to P bias voltage level (VDD/2). However, P-channel transistor 118 is still on and resists (or "contends with") the drop in voltage at node OUTPHVR. The contention causes the voltage across the drain and source of transistor 126 to spike during transitions from high to low input voltage VIN because the source of transistor 126 is at VDD/2 and the drain is at VSS.

Figure 2:
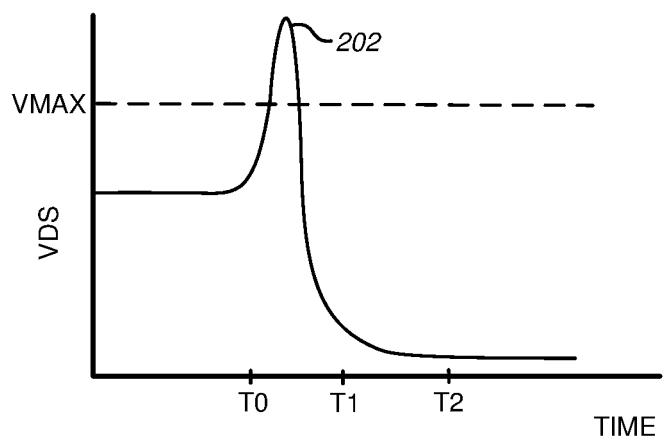
FIG. 2 illustrates a time history of drain-source voltage over time of a high voltage transistor at an output of a level shifter without HCI protection.

FIG. 2 illustrates a time history 202 of drain-source voltage VDS over time of N-channel transistor 126 during a switch from high to low input voltage VIN. At time T0, voltage at OUTNHVR is between N bias voltage and VSS. At time T1, voltage at node OUTMIDR is between VDD and VSS. At time T2, voltage at OUTPHVR is between VDD and P bias voltage. N-channel transistor 126 has a maximum voltage rating VMAX that is exceeded between time T0 and T1. This overvoltage condition can cause breakdown in the dielectric layer of transistor 126, from hot carrier injection, causing a shift in threshold voltage and increase in the amount of time required for transistor 126 to switch on and off. The increased time delay causing transistor 126 to be in an over-voltage condition for increasing amounts of time, thereby further increasing the amount of damage and threshold voltage shift.

Figure 3:
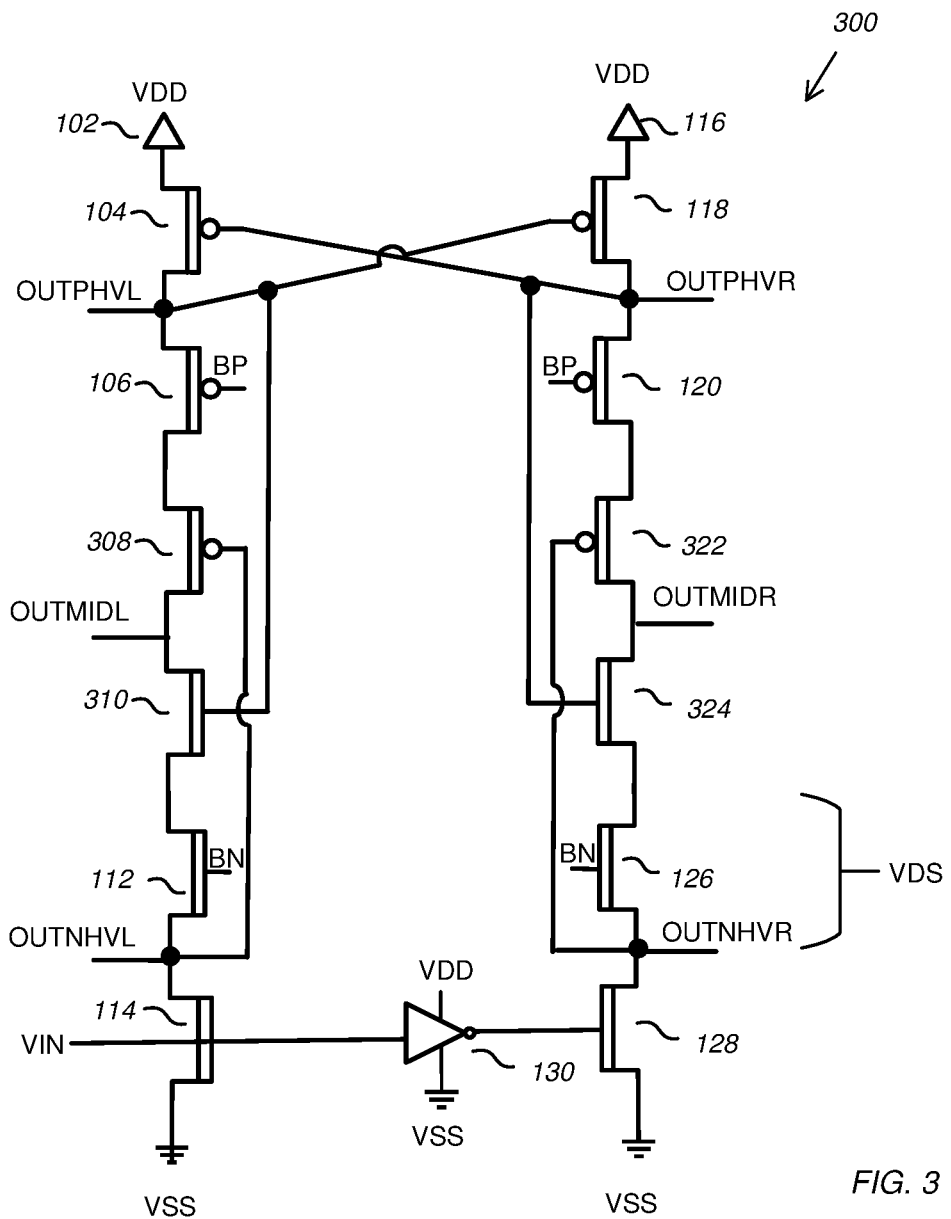
FIG. 3 illustrates a schematic diagram of an integrated circuit for a level shifter with HCI protection in accordance with selected embodiments of the present invention.

FIG. 3 illustrates a schematic diagram of an integrated circuit for level shifter 300 with HCI protection in accordance with selected embodiments of the present invention that includes an input stage with P-channel transistors 104, 106, 308, stacked in series with N-channel transistors 310, 112, 114. An output stage of level shifter 300 includes P-channel transistors 118, 120, 322 stacked in series with N-channel transistors 324, 126, 128. Inverter 130 has an input terminal coupled to an input voltage (VIN) and to a control gate of N-channel transistor 114. An output of inverter 130 is coupled to a control gate of N-channel transistor 128. Inverter 130 is further coupled between supply voltage VDD and ground.

An input side of level shifter 300 includes P-channel transistor 104 with a first current electrode coupled to voltage supply (VDD) 102, a second current electrode coupled to a first current electrode of P-channel transistor 106, and a control gate coupled to a control gate of N-channel transistor 324 and between a second (drain) electrode of P-channel transistor 118 and a first (source) current electrode of P-channel transistor 120. P-channel transistor 106 includes a control gate coupled to P bias voltage (BP) and a second current electrode coupled to a first current electrode of P-channel transistor 308. A second current electrode of P-channel transistor 308 is coupled to a first current electrode of N-channel transistor 310 and a control gate coupled output node OUTNHVR between a second (source) electrode of N-channel transistor 112 and a first (drain) electrode of N-channel transistor 114. In addition to the first current electrode coupled to the second current electrode of P-channel transistor 308, N-channel transistor 310 includes a second current electrode coupled to a first current electrode of N-channel transistor 112 and a control gate coupled to a control gate of P-channel transistor 118 and to output node OUTPHVL between the second (drain) terminal of P-channel transistor 104 and the first (source) current electrode of P-channel transistor 106. N-channel transistor 112 includes a second current electrode coupled to a first current electrode of N-channel transistor 114 and a control gate coupled to an N bias voltage (BN). N-channel transistor 114 further includes a second current electrode 114 coupled to supply voltage (VSS) and a control gate coupled to the input voltage (VIN) and the input of inverter 130.

An output side of level shifter 300 includes P-channel transistor 118 with a first current electrode coupled to voltage supply (VDD) 116, a second current electrode coupled to a first current electrode of P-channel transistor 120, and a control gate coupled to a control gate of N-channel transistor 324 and between a second (drain) electrode of P-channel transistor 118 and a first (source) current electrode of P-channel transistor 120. P-channel transistor 120 includes a control gate coupled to P bias voltage (BP) and a second current electrode coupled to a first current electrode of P-channel transistor 322. A second current electrode of P-channel transistor 322 is coupled to a first current electrode of N-channel transistor 324 and a control gate coupled to output node OUTNHVR between a second (source) electrode of N-channel transistor 126 and a first (drain)

electrode of N-channel transistor 128. In addition to the first current electrode coupled to the second current electrode of P-channel transistor 322, N-channel transistor 324 includes a second current electrode coupled to a first current electrode of N-channel transistor 126 and a control gate coupled to a control gate of P-channel transistor 118 and to output node OUTPHVL between the second (drain) terminal of P-channel transistor 118 and the first (source) current electrode of P-channel transistor 120. N-channel transistor 126 includes a second current electrode coupled to a first current electrode of N-channel transistor 128 and a control gate coupled to an N bias voltage (BN). N-channel transistor 128 further includes a second current electrode 128 coupled to supply voltage (VSS) and a control gate coupled to the output of inverter 130.

When switching from high to low input voltage VIN, transistors 126, 128, 322 and 324 turn on, pulling down the voltage at their drains. At the same time, transistors 118, 120 are turning off, and voltage across the drain and source of transistors 118, 120, 322 is brought down, affecting the drain voltage at transistor 324 and creating a period of high impedance at node OUTMIDR. The period of high impedance allows node OUTNHVR to be pulled down at the same time as node OUTPHVR.

When switching from low to high input voltage VIN, transistors 114, 112 and 310 turn on, pulling down the voltage at their drains. At the same time, transistors 118, 120, 322 are turning off, and voltage across the drain and source of transistors 118, 120, 322 is brought down, affecting the drain voltage at transistor 324 and creating a period of high impedance at node OUTMIDR. The period of high impedance allows node OUTNHVR to be pulled down at the same time as node OUTPHVR.

Figure 4:
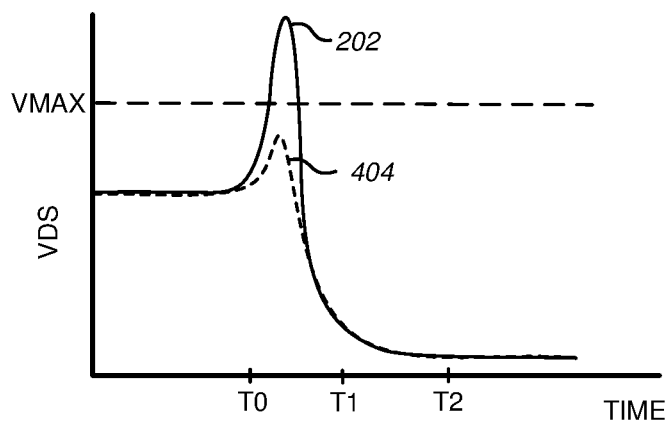
FIG. 4 illustrates a time history of drain-source voltage over time of a transistor at an output of a level shifter with and without HCI protection.

By tying the gates of N-channel transistors 310, 324 to respective output nodes OUTPHVL and OUTPHVR, transistors 310, 324 are connected to respective level shifted signals and are switched on and off less abruptly than transistors 112, 116 that are connected to a strongly driven, stable N bias voltage BN. Similarly, transistors 308, 322 are connected to respective level shifted signals and are switched on and off less abruptly than transistors 106, 120 with gates that are connected to a strongly driven, stable P bias voltage BP. FIG. 4 illustrates a time history of drain-source voltage over time of a transistor at an output of a level shifter with and without HCI protection. Comparing curve 202 corresponding to level shifter 100 in FIG. 1 to curve 404 corresponding to level shifter 300 in FIG. 3, the addition of transistors 308, 310, 322, 324 decreases the amount of time transistor 120 is in contention with transistor 126, thereby reducing the amount drain-source voltage across transistors 112 and 126 to below a maximum level when switching from high to low, and from low to high, input voltage VIN.

Figure 5:
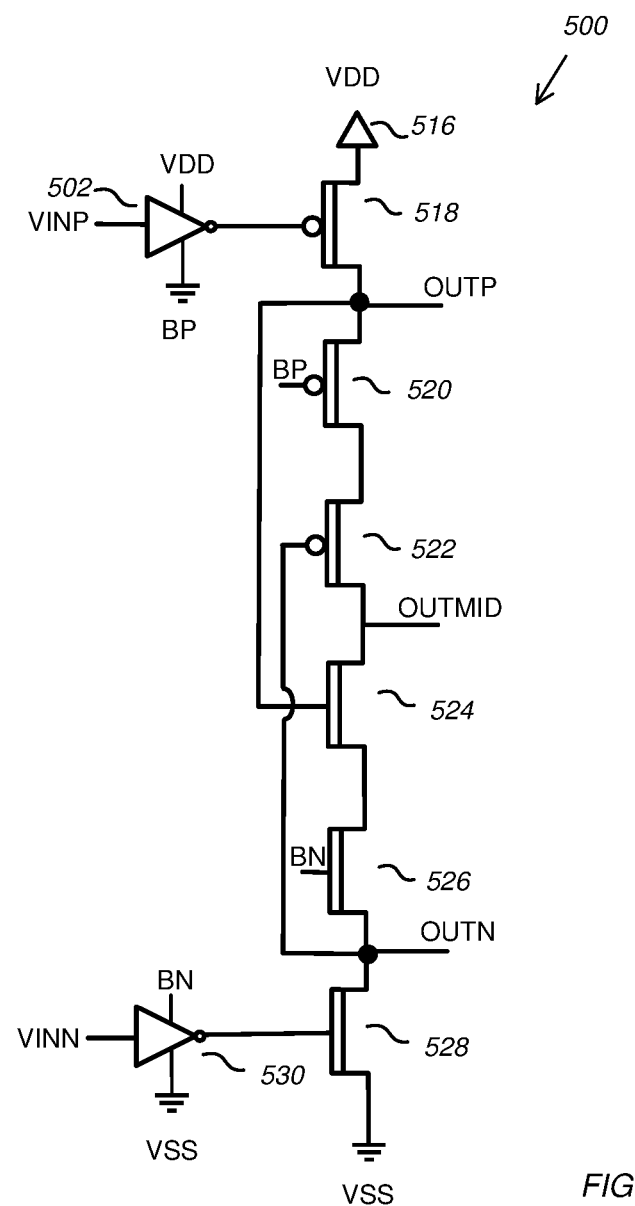
FIG. 5 illustrates a schematic diagram of an integrated circuit for an output stage with HCI protection in accordance with selected embodiments of the present invention.

A similar problem with hot carrier injection can occur during switching in a configuration of stacked transistors of an input/output (I/O) output stage circuit. FIG. 5 illustrates a schematic diagram of I/O output stage circuit 500 with HCl protection in accordance with selected embodiments of the present invention. P-channel transistors 518, 520, 522 are stacked in series with N-channel transistors 524, 526, 528. Inverter 502 has an input terminal coupled to P input voltage (VINP) and an output of inverter 502 is coupled to a control gate of N-channel transistor 518. Inverter 502 is further coupled between supply voltage VDD and P bias voltage (PN). Inverter 530 has an input terminal coupled to N input voltage (VINN) and an output of inverter 530 is coupled to a control gate of N-channel transistor 528. Inverter 530 is further coupled between N bias voltage (BN) and ground.

Due to P input voltage VINP being independent from N input voltage VINN, the two voltages may not switch at the same time, which can cause contention with transistor 524 to be subjected to higher than maximum rated drain-source voltage for a window of time. N bias voltage and P bias voltages are set to one-half VDD when VDD is a relatively high voltage, such as 3.3 Volts P-channel transistor 518 includes a first current electrode coupled to voltage supply (VDD) 516, a second current electrode coupled to a first current electrode of P-channel transistor 520, and a control gate coupled to the output of inverter 502. P-channel transistor 520 further includes a control gate coupled to P bias voltage (BP) and a second current electrode coupled to a first current electrode of P-channel transistor 522. A second current electrode of P-channel transistor 522 is coupled to a first current electrode of N-channel transistor 524 and a control gate coupled to node OUTN between a second (source) electrode of N-channel transistor 526 and a first (drain) electrode of N-channel transistor 528. In addition to the first current electrode coupled to the second current electrode of P-channel transistor 522, N-channel transistor 524 includes a second current electrode coupled to a first current electrode of N-channel transistor 526 and a control gate coupled to output node OUTP between the second (drain) terminal of P-channel transistor 518 and the first (source) current electrode of P-channel transistor 520. N-channel transistor 526 includes a second current electrode coupled to a first current electrode of N-channel transistor 528 and a control gate coupled to an N bias voltage (BN). N-channel transistor 528 further includes a second current electrode 528 coupled to supply voltage (VSS) and a control gate coupled to the output of inverter 530.

In configurations where input voltage VIN is relatively high, such as 3.3 Volts, N bias voltage BN and P bias voltage BP are set to one-half VDD. With input voltages VINP and VINN switching to high, transistor 518 turns on, transistor 526 is on, transistors 520 and 528 are off, and transistor 522 turns on. Voltage across the drain and source of transistor 518 is brought up, turning on transistor 524, thereby creating a period of high impedance at node OUTMID. The period of high impedance removes the contention and allows node OUTP to be pulled up at the same time as node OUTN. In this way, transistor 520 is not subjected to higher than maximum rated voltage during a switch in input voltages VINP and VINN from low to high.

When input voltage VIN is relatively low, such as 1.8 Volts, N bias voltage BN is set to VDD and P bias voltage is set to zero. With input voltages VINP and VINN switching to low, transistors 526, 528, 522 and 520 turn on, pulling down the voltage at their drains. At the same time, transistor 518 is turning off, transistor 524 is weakly biased by the low voltage minus threshold voltage, and the drain-source voltage of transistor 526 is brought down, with a period of contention at node OUTMID. Due to the weak biasing transistor 524, transistor 526 is can be subjected to higher than maximum rated voltage, potentially causing HCl damage, when input voltages VINP and VINN switch from high to low and VDD is a relatively low voltage such as 1.8 Volts.

Figure 6:
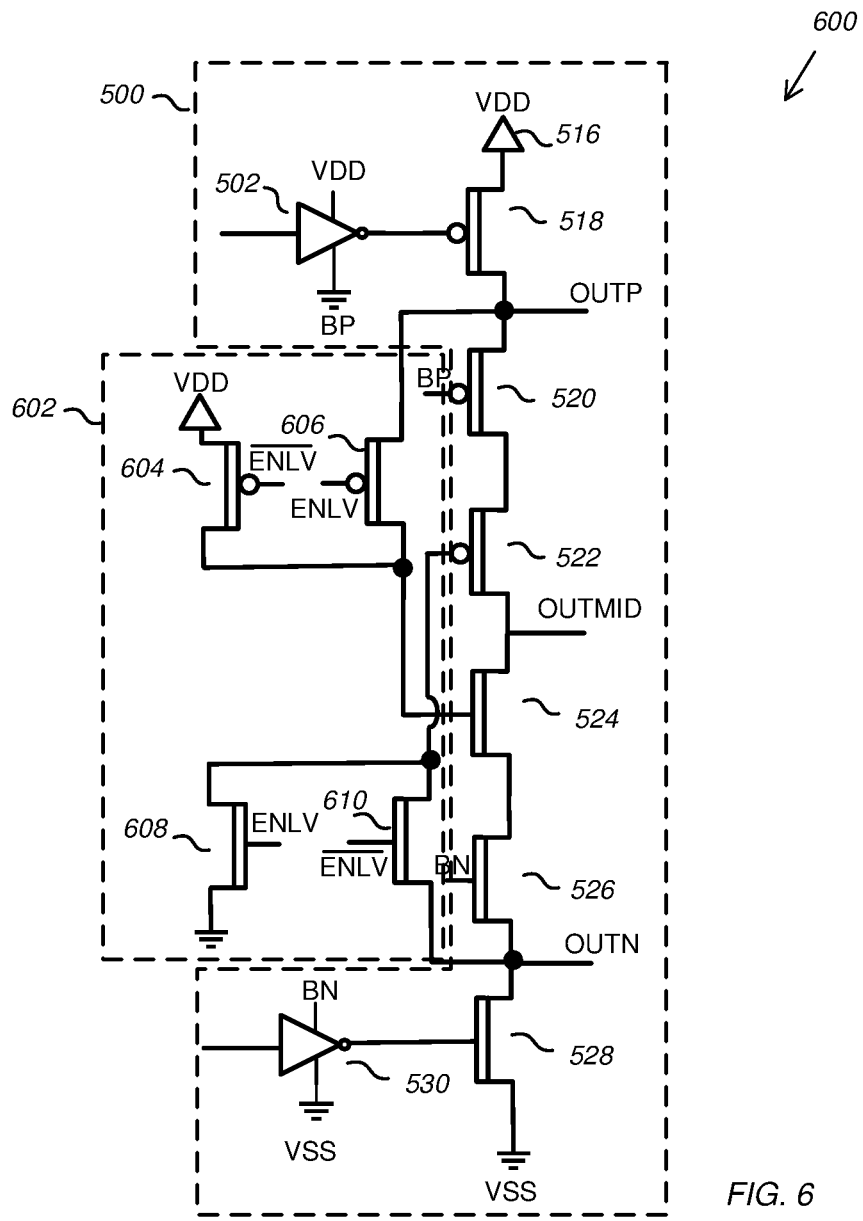
FIG. 6 illustrates a schematic diagram of an integrated circuit for a dual mode output stage in accordance with selected embodiments of the present invention.

An embodiment of an output stage circuit 600 that provides HCl protection in both high and low VDD modes is illustrated in FIG. 6. Output stage 600 includes output stage circuit 500 of FIG. 5 coupled to multiplexer circuitry 602 with a first multiplexer that includes P-channel transistors 604, 606 and a second multiplexer that includes N-channel transistors 608, 610.

P-channel transistor 604 includes a first current electrode coupled to supply voltage VDD, a second current electrode coupled to the control gate of N-channel transistor 524 and a control gate coupled to the complement of an enable low voltage (ENLV) signal. P-channel transistor 606 includes a first current electrode coupled to node OUTP, a second current electrode coupled to the control gate of N-channel transistor 524 and the second current electrode of P-channel transistor 606, and a control gate coupled to the ENLV signal. N-channel transistor 608 includes a first current electrode coupled to the control gate of P-channel transistor 522, a second current electrode coupled to ground, and a control gate coupled to the ENLV signal. N-channel transistor 610 includes a first current electrode coupled to the control gate of P-channel transistor 522, a second current electrode coupled between the second current electrode (source) of N-channel transistor 526 and the first current electrode (drain) of N-channel transistor 528, and a control gate coupled to the complement of the ENLV signal.

During operation when switching from a high to a low voltage, for example, from 3.3 to 1.8 Volts, the ENLV signal is asserted and the complement of the ENLV signal is deasserted. P-channel transistor 604 and N-channel transistor 608 turn on and P-channel transistor 606 and N-channel transistor 610 turn off. N bias voltage BN is set to VDD and P bias voltage is set to zero. Transistors 518-526 are on and transistor 528 is off. The voltage at the control gate of transistor 524 is the supply voltage VDD at the source of transistor 604, providing a strong on bias at the control gate of transistor 524. In addition, transistor 608 pulls down the signal on the control gate of transistor 522 and forces transistor 522 to turn on more strongly. Transistors 522 and 524 are controlled independently of bias voltages BP and BN and protect transistor 526 by keeping the drain-source voltage across transistor 526 below the maximum rated voltage for transistor 526.

During operation when switching from a low to a high voltage, for example, from 1.8 to 3.3 Volts, the ENLV signal is deasserted and the complement of the ENLV signal is asserted. P-channel transistor 606 and N-channel transistor 610 turn on and P-channel transistor 604 and N-channel transistor 608 turn off. N bias voltage BN and P bias voltage BP are set to one-half VDD. Transistors 518 and 522-528 turn on, and transistor 520 turns off. The voltage at the control gate is the drain voltage of transistor 604, causing a strong on bias at the control gate of transistor 524. In addition, transistor 610 pulls down the signal on the control gate transistor 522 and forces transistor 522 to turn on. Transistors 522 and 524 are controlled independently of bias voltages BP and BN and help reduce the maximum drain-source voltage across transistor 526 during the switch.

Thus, the configuration of output stage circuit 600 protects transistor 526 from over-voltage conditions when switching to both high and low voltage modes.

Figure 7:
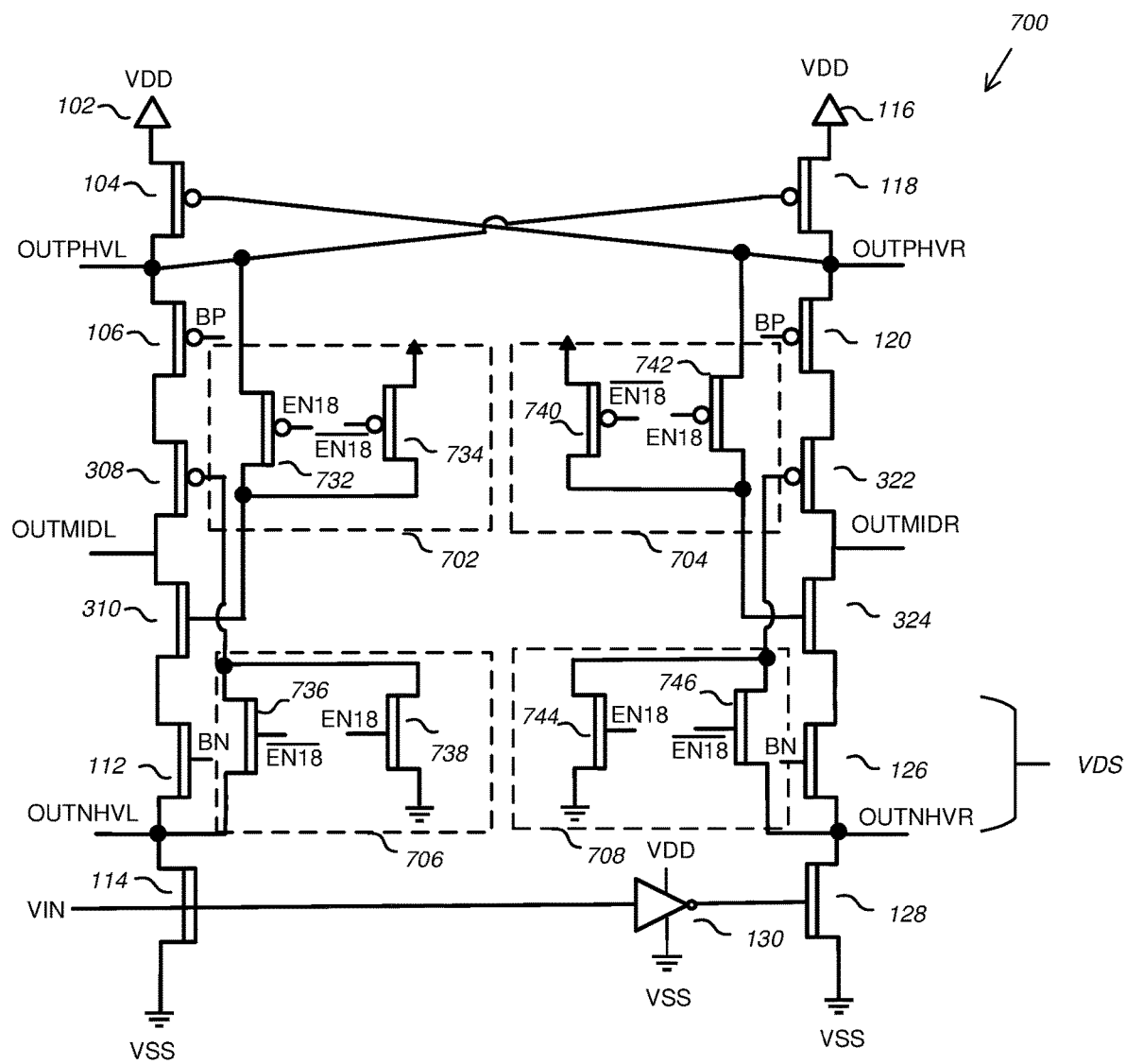
FIG. 7 illustrates a schematic diagram of an integrated circuit for a dual mode level shifter in accordance with selected embodiments of the present invention.

An embodiment of level shifter circuit 700 that provides HCl protection in both high and low VDD modes is illustrated in FIG. 7. Level shifter circuit 700 includes level shifter circuit 300 of FIG. 3 coupled to multiplexer circuitry 702, 704, 706, 708 that helps place transistors 308, 310, 322 and 324 in the appropriate operating state to protect transistors 106, 112, 120 and 126 from HCl damage when switching to low voltage.

Multiplexer circuit 702 includes P-channel transistor 732 includes a first current electrode coupled to node OUTPHVL, a second current electrode coupled to the control gate of N-channel transistor 310 and a control gate coupled to the enable low voltage (ENLV) signal. P-channel transistor 734 includes a first current electrode coupled to supply voltage VDD, a second current electrode coupled to the control gate of N-channel transistor 310 and the second current electrode of P-channel transistor 732, and a control gate coupled to the complement of the ENLV signal.

Multiplexer circuit 704 includes P-channel transistor 740 with a first current electrode coupled to supply voltage VDD, a second current electrode coupled to the control gate of N-channel transistor 324 and the second current electrode of P-channel transistor 742, and a control gate coupled to the complement of the ENLV signal. P-channel transistor 742 includes a first current electrode coupled to node OUTPHVR, a second current electrode coupled to the control gate of N-channel transistor 324 and a control gate coupled to the enable low voltage (ENLV) signal.

Multiplexer circuit 706 includes N-channel transistor 736 with a first current electrode coupled to the control gate of P-channel transistor 308, a second current electrode coupled to node OUTNHVL, and a control gate coupled to the complement of the ENLV signal. N-channel transistor 738 includes a first current electrode coupled to the control gate of P-channel transistor 308, a second current electrode coupled to ground, and a control gate coupled to the ENLV signal.

Multiplexer circuit 708 includes N-channel transistor 744 with a first current electrode coupled to the control gate of P-channel transistor 322, a second current electrode coupled to ground, and a control gate coupled to the ENLV signal. N-channel transistor 746 includes a first current electrode coupled to the control gate of P-channel transistor 322, a second current electrode coupled to node OUTNHVR, and a control gate coupled to the complement of the ENLV signal.

During operation when switching from a high to a low voltage, multiplexer circuit 704 provides a supply voltage VDD bias to the control gate of transistor 324, turning transistor 324 on, and multiplexer circuit 708 provides supply voltage to ground to bias the gate of transistor 322 to turn transistor 322 on. Without multiplexer circuits 704, 708, transistors 324 and 322 would be weakly biased and would not provide the same level of protection as they do with stronger bias voltages provided by multiplexer circuits 704, 708.

During operation when switching from a low to a high voltage, level shifter circuit 700 operates very similar to level shifter circuit 300 in FIG. 3. Multiplexer circuit 702 ties the control gate of transistor 310 to node OUTPHVL and multiplexer circuit 706 ties the control gate of transistor 308 to node OUTNHVL. Similarly, multiplexer circuit 704 ties the control gate of transistor 324 to node OUTPHVR and multiplexer circuit 708 ties the control gate of transistor 322 to node OUTNHVR.

Thus, for both the switch from high to low voltage, and from low to high voltage, transistors 308, 322, 310, 324 of level shifter circuit 700 provide protection that prevents the drain-source voltages from exceeding the maximum rated voltage of transistors 106, 112, 120, 126.

By now it should be appreciated that standard stacked transistor protection schemes are exposed to sensitivities in timing and contention during switching that can lead to momentary increases in drain-source voltage across transistors, which is particularly dangerous as they are operated at higher voltages than their maximum rating. Embodiments of the invention disclosed herein take advantage of fast capacitive coupling local to the stacked transistors to ensure that the dynamic behavior of the current electrodes of the transistors limit voltages across the electrodes below their maximum rating.

In selected embodiments, a circuit can comprise a first transistor having a first current electrode coupled to a first voltage supply terminal, a second current electrode coupled to a first circuit node, and a gate electrode coupled to receive a first input signal; a second transistor having a first current electrode coupled to the second current electrode of the first transistor, a second current electrode, and a gate electrode coupled to receive a first bias voltage; a third transistor having a first current electrode coupled to the second current electrode of the second transistor, a second current electrode coupled to a second circuit node, and a gate electrode; a fourth transistor having a first current electrode coupled to the second circuit node, a second current electrode coupled to a third circuit node, and a gate electrode coupled to receive a second bias voltage, wherein the gate electrode of the third transistor is coupled to the third circuit node; and a fifth transistor having a first current electrode coupled to the third circuit node, a second current electrode coupled to a second voltage supply terminal, and a gate electrode coupled to receive a second input signal. The first voltage supply terminal supplies a first supply voltage, the second voltage supply terminal supplies a second supply voltage, and the second node is configured to have a voltage swing between the first and second supply voltages, the first input signal is configured to have a first partial voltage swing between the first supply voltage and a first intermediate voltage part way between the first and second supply voltages, and the second input signal is configured to have a second partial voltage swing between the second supply voltage and a second intermediate voltage part way between the first and second supply voltages, and the first partial voltage swing and the second partial voltage swing are nonoverlapping.

In another aspect, the circuit can further comprise a sixth transistor coupled between the third and fourth transistors, wherein a first current electrode of the sixth transistor is coupled to the second current electrode of the third transistor, a gate electrode of the sixth transistor is coupled to the second current electrode of the first transistor, and a second current electrode of the sixth transistor is coupled to the first current electrode of the fourth transistor.

In another aspect, the circuit can be further characterized as a level shifter, wherein the first, second, and third transistors are p-type transistors and the fourth and fifth transistors are n-type transistors. The circuit can further comprise a sixth p-type transistor cross-coupled with the first transistor, wherein the sixth p-type transistor has a first current electrode coupled to the first voltage supply terminal, a gate electrode coupled to the first circuit node, and a second current electrode coupled to provide the first input signal. A seventh n-type transistor has a first electrode coupled to the second current electrode of the sixth transistor, a second current electrode coupled to the second voltage supply terminal, and a gate electrode coupled to receive an inverse of the second input signal.

In another aspect, the circuit can further comprise an eighth n-type transistor coupled between the third and fourth transistors, wherein a first current electrode of the eighth n-type transistor is coupled to the second circuit node, a gate electrode of the eighth n-type transistor is coupled to the first circuit node, and a second current electrode of the eighth n-type transistor is coupled to the first current electrode of the fourth transistor.

In another aspect, the circuit can be further characterized as a level shifter, wherein the first, second, and third transistors are n-type transistors and the fourth and fifth transistors are p-type transistors, and wherein the circuit can further comprise a sixth p-type transistor cross-coupled with the fifth transistor, wherein the sixth p-type transistor has a first current electrode coupled to the second voltage supply terminal, a gate electrode coupled to the third circuit node, and a second current electrode coupled to provide the second input signal; and a seventh n-type transistor, wherein the seventh n-type transistor has a first electrode coupled to the second current electrode of the sixth transistor, a second current electrode coupled to the first voltage supply terminal, and a gate electrode coupled to receive an inverse of the first input signal.

In another aspect, the circuit can be characterized as a programmable level shifter configured to have a first mode of operation and a second mode of operation, wherein the gate electrode of the third transistor is coupled to the third circuit node via a multiplexer, wherein the multiplexer is configured to during the first mode of operation, connect the gate electrode of the third transistor to the third circuit node, and during the second mode of operation, mutually exclusive of the first mode of operation, disconnect the gate electrode of the third transistor from the third circuit node.

In another aspect, the multiplexer can be further configured to, during the second mode of operation, connect the gate electrode of the third transistor to the second voltage supply terminal, and during the first mode of operation, disconnect the gate electrode of the third transistor from the second voltage supply terminal.

In another aspect, the circuit can be characterized as a level shifter configured to, during the first mode of operation, level shift one of the first or the second input signals from a first voltage domain to a second voltage domain, and during the second mode of operation, level shift the one of the first or the second input signals from the first voltage domain to a third voltage domain, wherein the third voltage domain provides a different highest supply voltage as compared to a highest supply voltage of the second voltage domain.

In another aspect, the circuit can further comprise a sixth transistor (m2n/m2p) coupled between the third and fourth transistors, wherein a first current electrode of the sixth transistor is coupled to the second current electrode of the third transistor, a gate electrode of the sixth transistor is coupled to the second current electrode of the first transistor via a second multiplexer, and a second current electrode of the sixth transistor is coupled to the first current electrode of the fourth transistor, wherein the second multiplexer is configured to: during the first mode of operation, connect the gate electrode of the sixth transistor to the first circuit node, and during the second mode of operation, disconnect the gate electrode of the third transistor from the first circuit node and connect the gate electrode of the third transistor to the first voltage supply terminal.

In another aspect, the circuit can further comprise a first inverter having a first power terminal coupled to receive the first voltage supply voltage and a second power terminal coupled to receive the first intermediate voltage, and having an output coupled to provide the first input signal to the gate of the first transistor; and a second inverter having a first power terminal coupled to receive the second intermediate voltage and a second power terminal coupled to receive the second voltage supply voltage, and having an output coupled to provide the second input signal to the gate of the fifth transistor.

In another aspect, the circuit can be further characterized as an output stage, and the second circuit node is configured to provide an output of the output stage.

In another aspect, the first, second, and third transistors can be p-type transistors and the fourth and fifth transistors are n-type transistors.

In another aspect, the circuit can further comprise a sixth n-type transistor coupled between the third and fourth transistors and having a first current electrode coupled to the second current electrode of third transistor, a control electrode coupled to the first circuit node, and a second current electrode coupled to the first currently electrode of the fourth transistor.

In another aspect, the first, second, and third transistors are n-type transistors and the fourth and fifth transistors are p-type transistors.

In other selected embodiments, a circuit can comprise a pair of cross-coupled transistors, including a first transistor and a second transistor, wherein: the first transistor has a first current electrode coupled to a first voltage supply terminal, a second current electrode coupled to a first output node, and a gate electrode, the second transistor has a first current electrode coupled to the first voltage supply terminal, a second current electrode coupled to a second output node, and a gate electrode coupled to the gate electrode of the first transistor; a third transistor having a first current electrode coupled the second current electrode of the first transistor, a second current electrode, and a gate electrode coupled to receive a first bias voltage; a fourth transistor having a first current electrode coupled to the second current electrode of the third transistor, a second current electrode, and a gate electrode coupled to the first output node; a fifth transistor having a first current electrode coupled to the second current electrode of the fourth transistor, a second current electrode coupled to a second output node, and a gate electrode coupled to receive a second bias voltage; and a sixth transistor having a first current electrode coupled to the second output node, a second current electrode coupled to a second voltage supply terminal, and a gate electrode coupled to receive an input signal, wherein the first voltage supply terminal supplies a first supply voltage and the second voltage supply terminal supplies a second supply voltage which is less than the first supply voltage, the input signal varies between the second supply voltage and a third supply voltage which is greater than the second supply voltage but less than the first supply voltage, the first output signal varies between an intermediate voltage and the first supply voltage, and the second output signal varies between the second supply voltage and the intermediate voltage.

In another aspect, the third supply voltage can be lower than the intermediate voltage.

In another aspect, the circuit can further comprise a seventh transistor between the third and fourth transistors, the seventh transistor having a first current electrode coupled to the second current electrode of the third transistor, a second current electrode coupled to the first current electrode of the fourth transistor, and a gate electrode coupled to the second output node.

In another aspect, the circuit can be characterized as a programmable level shifter configured to have a first mode of operation and a second mode of operation which is mutually exclusive of the first mode of operation, the circuit further comprising a first multiplexer coupled between the gate electrode of the fourth transistor and the first output node, and a second multiplexer coupled between the gate electrode of the seventh transistor and the second output node, wherein the first multiplexer is configured to, during the first mode of operation, connect the gate electrode of the fourth transistor to the first output node, and, during the second mode of operation, disconnect the gate electrode of the fourth transistor from the first output node and instead connect the gate electrode of the fourth transistor to the first voltage supply terminal, and the second multiplexer is configured to, during the first mode of operation, connect the gate electrode of the seventh transistor to the second output node, and, during the second mode of operation, disconnect the gate electrode of the seventh transistor from the second output node and instead connect the gate electrode of the seventh transistor to the second voltage supply terminal.

In another aspect, during the first mode of operation, the circuit can be configured to level shift the input signal from a first voltage domain to a second voltage domain, and during the second mode of operation, the circuit is configured to level shift the input signal from the first voltage domain to a third voltage domain, wherein the third voltage domain provides a lower highest supply voltage as compared to a highest supply voltage of the second voltage domain.

In another aspect, the circuit can further comprise an eighth transistor having a first current electrode coupled to the second current electrode of the second transistor, a second current electrode coupled to the second voltage supply terminal, and a control electrode coupled to receive a second input signal, wherein the input signal is an inverse of the second input signal.

Although the disclosure is described herein with reference to specific embodiments, various modifications and changes can be made without departing from the scope of the present disclosure as set forth in the claims below. For example, embodiments disclosed herein may be used in various types of devices that used stacked MOSFETs, in addition to level shifter circuits and output stage circuits. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit comprising:
 a first transistor having a first current electrode coupled to a first voltage supply terminal, a second current electrode coupled to a first circuit node, and a gate electrode coupled to receive a first input signal;

a second transistor having a first current electrode coupled to the second current electrode of the first transistor, a second current electrode, and a gate electrode coupled to receive a first bias voltage;

a third transistor having a first current electrode coupled to the second current electrode of the second transistor, a second current electrode coupled to a second circuit node, and a gate electrode;

a fourth transistor having a first current electrode coupled to the second circuit node, a second current electrode coupled to a third circuit node, and a gate electrode coupled to receive a second bias voltage, wherein the gate electrode of the third transistor is coupled to the third circuit node; and a fifth transistor having a first current electrode coupled to the third circuit node, a second current electrode coupled to a second voltage supply terminal, and a gate electrode coupled to receive a second input signal, wherein:

the first voltage supply terminal supplies a first supply voltage, the second voltage supply terminal supplies a second supply voltage, and the second node is configured to have a voltage swing between the first and second supply voltages, the first input signal is configured to have a first partial voltage swing between the first supply voltage and a first intermediate voltage part way between the first and second supply voltages, and the second input signal is configured to have a second partial voltage swing between the second supply voltage and a second intermediate voltage part way between the first and second supply voltages, and the first partial voltage swing and the second partial voltage swing are nonoverlapping.

2. The circuit of claim 1, further comprising:

a sixth transistor coupled between the third and fourth transistors, wherein a first current electrode of the sixth transistor is coupled to the second current electrode of the third transistor, a gate electrode of the sixth transistor is coupled to the second current electrode of the first transistor, and a second current electrode of the sixth transistor is coupled to the first current electrode of the fourth transistor.

3. The circuit of claim 1, wherein the circuit is further characterized as a level shifter, wherein the first, second, and third transistors are p-type transistors and the fourth and fifth transistors are n-type transistors, and wherein the circuit further comprises:

a sixth p-type transistor cross-coupled with the first transistor, wherein the sixth p-type transistor has a first current electrode coupled to the first voltage supply terminal, a gate electrode coupled to the first circuit node, and a second current electrode coupled to provide the first input signal; and a seventh n-type transistor, wherein the seventh n-type transistor has a first electrode coupled to the second current electrode of the sixth transistor, a second current electrode coupled to the second voltage supply terminal, and a gate electrode coupled to receive an inverse of the second input signal.

4. The circuit of claim 2, further comprising:

an eighth n-type transistor coupled between the third and fourth transistors, wherein a first current electrode of the eighth n-type transistor is coupled to the second circuit node, a gate electrode of the eighth n-type transistor is coupled to the first circuit node, and a second current electrode of the eighth n-type transistor is coupled to the first current electrode of the fourth transistor.

5. The circuit of claim 1, wherein the circuit is further characterized as a level shifter, wherein the first, second, and third transistors are n-type transistors and the fourth and fifth transistors are p-type transistors, and wherein the circuit further comprises:

a sixth p-type transistor cross-coupled with the fifth transistor, wherein the sixth p-type transistor has a first current electrode coupled to the second voltage supply terminal, a gate electrode coupled to the third circuit node, and a second current electrode coupled to provide the second input signal; and a seventh n-type transistor, wherein the seventh n-type transistor has a first electrode coupled to the second current electrode of the sixth transistor, a second current electrode coupled to the first voltage supply terminal, and a gate electrode coupled to receive an inverse of the first input signal.

6. The circuit of claim 1, wherein the circuit is characterized as a programmable level shifter configured to have a first mode of operation and a second mode of operation, wherein the gate electrode of the third transistor is coupled to the third circuit node via a multiplexer, wherein the multiplexer is configured to:

during the first mode of operation, connect the gate electrode of the third transistor to the third circuit node, and during the second mode of operation, mutually exclusive of the first mode of operation, disconnect the gate electrode of the third transistor from the third circuit node.

7. The circuit of claim 6, wherein the multiplexer is further configured to:

during the second mode of operation, connect the gate electrode of the third transistor to the second voltage supply terminal, and during the first mode of operation, disconnect the gate electrode of the third transistor from the second voltage supply terminal.

8. The circuit of claim 7, wherein the circuit is characterized as a level shifter configured to, during the first mode of operation, level shift one of the first or the second input signals from a first voltage domain to a second voltage domain, and during the second mode of operation, level shift the one of the first or the second input signals from the first voltage domain to a third voltage domain, wherein the third voltage domain provides a different highest supply voltage as compared to a highest supply voltage of the second voltage domain.

9. The circuit of claim 7, further comprising a sixth transistor (m2n/m2p) coupled between the third and fourth transistors, wherein a first current electrode of the sixth transistor is coupled to the second current electrode of the third transistor, a gate electrode of the sixth transistor is coupled to the second current electrode of the first transistor via a second multiplexer, and a second current electrode of the sixth transistor is coupled to the first current electrode of the fourth transistor, wherein the second multiplexer is configured to:

during the first mode of operation, connect the gate electrode of the sixth transistor to the first circuit node, and during the second mode of operation, disconnect the gate electrode of the third transistor from the first circuit node and connect the gate electrode of the third transistor to the first voltage supply terminal.

10. The circuit of claim 1, further comprising:
a first inverter having a first power terminal coupled to receive the first voltage supply voltage and a second power terminal coupled to receive the first intermediate voltage, and having an output coupled to provide the first input signal to the gate of the first transistor; and
a second inverter having a first power terminal coupled to receive the second intermediate voltage and a second power terminal coupled to receive the second voltage supply voltage, and having an output coupled to provide the second input signal to the gate of the fifth transistor.

11. The circuit of claim 10, wherein the circuit is further characterized as an output stage, and the second circuit node is configured to provide an output of the output stage.

12. The circuit of claim 10, wherein the first, second, and third transistors are p-type transistors and the fourth and fifth transistors are n-type transistors.

13. The circuit of claim 12, further comprising:
a sixth n-type transistor coupled between the third and fourth transistors and having a first current electrode coupled to the second current electrode of third transistor, a control electrode coupled to the first circuit node, and a second current electrode coupled to the first currently electrode of the fourth transistor.

14. The circuit of claim 10, wherein the first, second, and third transistors are n-type transistors and the fourth and fifth transistors are p-type transistors.

15. A circuit comprising:
a pair of cross-coupled transistors, including a first transistor and a second transistor, wherein:
the first transistor has a first current electrode coupled to a first voltage supply terminal, a second current electrode coupled to a first output node, and a gate electrode,
the second transistor has a first current electrode coupled to the first voltage supply terminal, a second current electrode coupled to a second output node, and a gate electrode coupled to the gate electrode of the first transistor;
a third transistor having a first current electrode coupled the second current electrode of the first transistor, a second current electrode, and a gate electrode coupled to receive a first bias voltage;
a fourth transistor having a first current electrode coupled to the second current electrode of the third transistor, a second current electrode, and a gate electrode coupled to the first output node;
a fifth transistor having a first current electrode coupled to the second current electrode of the fourth transistor, a second current electrode coupled to a second output node, and a gate electrode coupled to receive a second bias voltage; and
a sixth transistor having a first current electrode coupled to the second output node, a second current electrode coupled to a second voltage supply terminal, and a gate electrode coupled to receive an input signal, wherein:

the first voltage supply terminal supplies a first supply voltage and the second voltage supply terminal supplies a second supply voltage which is less than the first supply voltage,
the input signal varies between the second supply voltage and a third supply voltage which is greater than the second supply voltage but less than the first supply voltage, the first output signal varies between an intermediate voltage and the first supply voltage, and the second output signal varies between the second supply voltage and the intermediate voltage.

16. The circuit of claim 15, wherein the third supply voltage is lower than the intermediate voltage.

17. The circuit of claim 15, further comprising a seventh transistor between the third and fourth transistors, the seventh transistor having a first current electrode coupled to the second current electrode of the third transistor, a second current electrode coupled to the first current electrode of the fourth transistor, and a gate electrode coupled to the second output node.

18. The circuit of claim 17, wherein the circuit is characterized as a programmable level shifter configured to have a first mode of operation and a second mode of operation which is mutually exclusive of the first mode of operation, the circuit further comprising a first multiplexer coupled between the gate electrode of the fourth transistor and the first output node, and a second multiplexer coupled between the gate electrode of the seventh transistor and the second output node, wherein:
the first multiplexer is configured to, during the first mode of operation, connect the gate electrode of the fourth transistor to the first output node, and, during the second mode of operation, disconnect the gate electrode of the fourth transistor from the first output node and instead connect the gate electrode of the fourth transistor to the first voltage supply terminal, and
the second multiplexer is configured to, during the first mode of operation, connect the gate electrode of the seventh transistor to the second output node, and, during the second mode of operation, disconnect the gate electrode of the seventh transistor from the second output node and instead connect the gate electrode of the seventh transistor to the second voltage supply terminal.

19. The circuit of claim 18, wherein, during the first mode of operation, the circuit is configured to level shift the input signal from a first voltage domain to a second voltage domain, and during the second mode of operation, the circuit is configured to level shift the input signal from the first voltage domain to a third voltage domain, wherein the third voltage domain provides a lower highest supply voltage as compared to a highest supply voltage of the second voltage domain.

20. The circuit of claim 17, further comprising an eighth transistor having a first current electrode coupled to the second current electrode of the second transistor, a second current electrode coupled to the second voltage supply terminal, and a control electrode coupled to receive a second input signal, wherein the input signal is an inverse of the second input signal.

* * * * *